(12) United States Patent
Partridge et al.

(10) Patent No.: US 12,706,442 B2
(45) Date of Patent: Aug. 11, 2026

(54) FREEFORM COLLIMATOR LENS FOR ANGLED FACET LASER DEVICES

(71) Applicant: Agilent Technologies, Inc., Santa Clara, CA (US)

(72) Inventors: Guthrie Partridge, Santa Clara, CA (US); Joao Mendes-Lopes, Lisbon (PT)

(73) Assignee: Agilent Technologies, Inc., Santa Clara, CA (US)

( * ) Notice: Subject to any disclaimer, the term of this patent is extended or adjusted under 35 U.S.C. 154(b) by 571 days.

(21) Appl. No.: 18/019,722

(22) PCT Filed: Aug. 12, 2021

(86) PCT No.: PCT/US2021/045726
§ 371 (c)(1),
(2) Date: Feb. 3, 2023

(87) PCT Pub. No.: WO2022/036085
PCT Pub. Date: Feb. 17, 2022

(65) Prior Publication Data

US 2023/0299558 A1 Sep. 21, 2023

Related U.S. Application Data

(60) Provisional application No. 63/066,070, filed on Aug. 14, 2020.

(51) Int. Cl.
*H01S 5/14* (2006.01)
*H01S 5/02253* (2021.01)
*H01S 5/50* (2006.01)

(52) U.S. Cl.
CPC .......... *H01S 5/147* (2013.01); *H01S 5/02253* (2021.01); *H01S 5/5027* (2013.01); *H01S 5/5045* (2013.01)

(58) Field of Classification Search
CPC .... H01S 5/147; H01S 5/02253; H01S 5/5027; H01S 5/5045; H01S 3/06708;
(Continued)

(56) References Cited

U.S. PATENT DOCUMENTS 5,392,308 A * 2/1995 Welch .................... G02B 6/305 372/100
5,594,744 A * 1/1997 Lefevre .................. H01S 5/143 372/102
(Continued)

FOREIGN PATENT DOCUMENTS

CN 101320885 A 12/2008
CN 101750752 A 6/2010
(Continued)

OTHER PUBLICATIONS

Translation of WO 2012042469.*
(Continued)

*Primary Examiner* — Xinning(Tom) Niu
(74) *Attorney, Agent, or Firm* — Foley & Lardner LLP

(57) ABSTRACT

An apparatus having a waveguide and a freeform collimating lens. The waveguide is characterized by a waveguide axis and a planar end having a normal axis that is inclined at an end angle that is greater than 0 degrees with respect to the waveguide axis. The freeform collimating lens collimates light leaving the planar end of the waveguide into a collimated light beam characterized by a beam direction that is parallel to the waveguide axis. The apparatus inhibits reflections from the planar end of the waveguide from propagating back down the waveguide while providing a collimated light beam having a direction parallel to the axis of the waveguide.

11 Claims, 4 Drawing Sheets

(58) Field of Classification Search
CPC .. H01S 3/06754; H01S 3/005; H01S 3/06745; H01S 5/02325; H01S 5/3402; H01S 5/1085; H01S 5/141; G02B 3/02; G02B 7/003; G02B 27/30
See application file for complete search history.

(56) References Cited

U.S. PATENT DOCUMENTS

| | | | | |
|---|---|---|---|---|
| 7,565,084 | B1 | 7/2009 | Wach | |
| 9,876,330 | B1 | 1/2018 | Partridge | |
| 10,732,105 | B1 | 8/2020 | Partridge | |
| 2003/0007523 | A1* | 1/2003 | Chapman | H01S 5/141 372/20 |
| 2004/0207913 | A1* | 10/2004 | Mehuys | H01S 3/06754 359/341.3 |
| 2008/0226229 | A1 | 9/2008 | Nakagawa | |
| 2011/0090557 | A1 | 4/2011 | Ide et al. | |
| 2016/0301191 | A1 | 10/2016 | Orcutt | |
| 2017/0170629 | A1* | 6/2017 | Lerner | G02B 19/0052 |
| 2020/0067277 | A1* | 2/2020 | Kaneda | H01S 5/32325 |

FOREIGN PATENT DOCUMENTS

| | | | | |
|---|---|---|---|---|
| CN | 101969175 A | 2/2011 | | |
| CN | 103175095 A | 6/2013 | | |
| CN | 103730823 A | 4/2014 | | |
| CN | 106253042 A | 12/2016 | | |
| EP | 1691458 | 8/2006 | | |
| JP | H09-260735 A | 10/1997 | | |
| JP | 2004-126586 A | 4/2004 | | |
| JP | 2005-167006 A | 6/2005 | | |
| JP | 2006-339622 A | 12/2006 | | |
| JP | 2009-260735 A | 11/2009 | | |
| JP | 2010-016032 A | 1/2010 | | |
| JP | 2010-074167 A | 4/2010 | | |
| JP | 2012-178436 A | 9/2012 | | |
| KR | 20060124310 | 12/2006 | | |
| WO | WO-2012042469 A1 * | 4/2012 | | G02F 1/3534 |
| WO | WO 2019/166575 A1 | 9/2019 | | |

OTHER PUBLICATIONS

Epo, et al., "Extended European Search Report Received mailed on Aug. 12, 2024," Application No. 21856717.0, 6 pages.

Zexin, Feng et al., "Freeform Lens Design for Laser Diode Beam Shaping," Proceedings of Spie vol. 10815, Doi: 10.1117/12.2500048, Issn 0277-786X, Nov. 5, 2018, 8 pages.

Office Action dated Jun. 24, 2025 on JP Application 2023-507395 (8 pages w/English Translation).

International Searching Authority. "International Search Report and Written Opinion," issued in connection with PCT Application No. PCT/US2021/045726, 6 pages.

Office Action issued in corresponding Japanese Patent Application No. 2023-507395 dated Dec. 5, 2025 (with English translation, 5 pages).

First Office Action on CN Patent App. No. 202180056298.6 dated Jul. 29, 2025, 14 pages (with English translation).

Second Office Action on Chinese Patent App. No. 202180056298.6 dated Apr. 30, 2026, 9 pages (with English translation).

* cited by examiner

FREEFORM COLLIMATOR LENS FOR ANGLED FACET LASER DEVICES

CROSS-REFERENCE TO RELATED APPLICATION

This application is a U.S. national stage entry of International Application No. PCT/US21/45726, filed on Aug. 12, 2021, which claims priority to and benefit of U.S. Provisional Patent Application No. 63/066,070, filed on Aug. 14, 2020, the contents of which are incorporated herein by reference in their entirety.

BACKGROUND

A quantum cascade laser device (QCL) typically consists of an elongated approximately rectangular box active semiconductor waveguide structure affixed to a metal submount that provides thermal and electrical contacts. The divergent light emitted from the front facet of the waveguide of such a device is commonly collimated using an aspherical, high numerical aperture lens that is effective in correcting spherical aberrations.

QCL device waveguides are most commonly fabricated with a normal-incidence output facet. That is, the normal of the output facet is parallel with the waveguide long axis and the direction of light propagation. This is done for reasons of convenience and ease of fabrication, since light is emitted straight along the device axis such that it may be mounted squarely on the submount and collimated by a lens aligned on-axis with the waveguide, regardless of wavelength.

However, it has been demonstrated that introducing an angle (7-10 degrees typical) to the output facet of a quantum cascade laser waveguide can both enhance its performance (maximum power, spatial mode quality) while simultaneously reducing or eliminating the need for high complexity, high cost multi-layer anti-reflection coatings.

Unfortunately, introducing an angled facet adds complications to the broader optical design. The angled facet refracts the emitted light from the waveguide at an angle relative to the long axis of the gain chip. In principle, the beam steering effect can be corrected by mounting the collimating lens at an angle with respect to the gain chip mount so that light enters the collimating lens along the central axis of the collimating lens. This also requires that the external cavity be rotated to accommodate the new beam direction. However, this solution introduces significant complexity to the mounting schemes for the gain chip and collimating lens. This solution also would not necessarily correct for refractive beam steering in the case that the angle of propagation out of the waveguide has a wavelength dependence, nor would it eliminate non-rotationally symmetric aberrations resulting from a shifting object plane distance.

SUMMARY

The present invention includes an apparatus having a waveguide and a freeform collimating lens. The waveguide is characterized by a waveguide axis and a planar end having a normal axis that is inclined at an end angle that is greater than 0 degrees with respect to the waveguide axis. The freeform collimating lens collimates light leaving the planar end of the waveguide into a collimated light beam characterized by a beam direction that is parallel to the waveguide axis.

In one aspect, the end angle is greater than 7 degrees.

In another aspect, the apparatus also includes an optical amplifier that amplifies light that is reflected from the planar end, the end angle is chosen such that an intensity of light reflected from the planar end is insufficient to cause lasing in a system incorporating the apparatus.

In another aspect, the optical amplifier includes a quantum cascade gain chip.

In another aspect, the optical amplifier includes a doped optical fiber.

In another aspect, the apparatus also includes an external cavity reflector that returns a collimated beam of light to the free-form collimating lens, the returned light travelling in a direction parallel to the waveguide axis.

In another aspect, the external cavity has a wavelength selective filter.

In another aspect, the wavelength selective filter includes a diffraction grating.

In another aspect, the freeform collimating lens includes a freeform concave surface proximate to the planar end and a spherical convex surface distal to the planar end.

In another aspect, the apparatus also includes a lens mount that positions the freeform collimating lens relative to the quantum cascade gain chip such that the optical axis of the free-form lens is parallel to the waveguide axis.

BRIEF DESCRIPTION OF THE DRAWINGS

FIG. 2 illustrates a gain chip having a facet that is cut at a slight angle.

FIG. 3 illustrates a gain chip with a rotated collimating lens.

DETAILED DESCRIPTION

Figure 1:
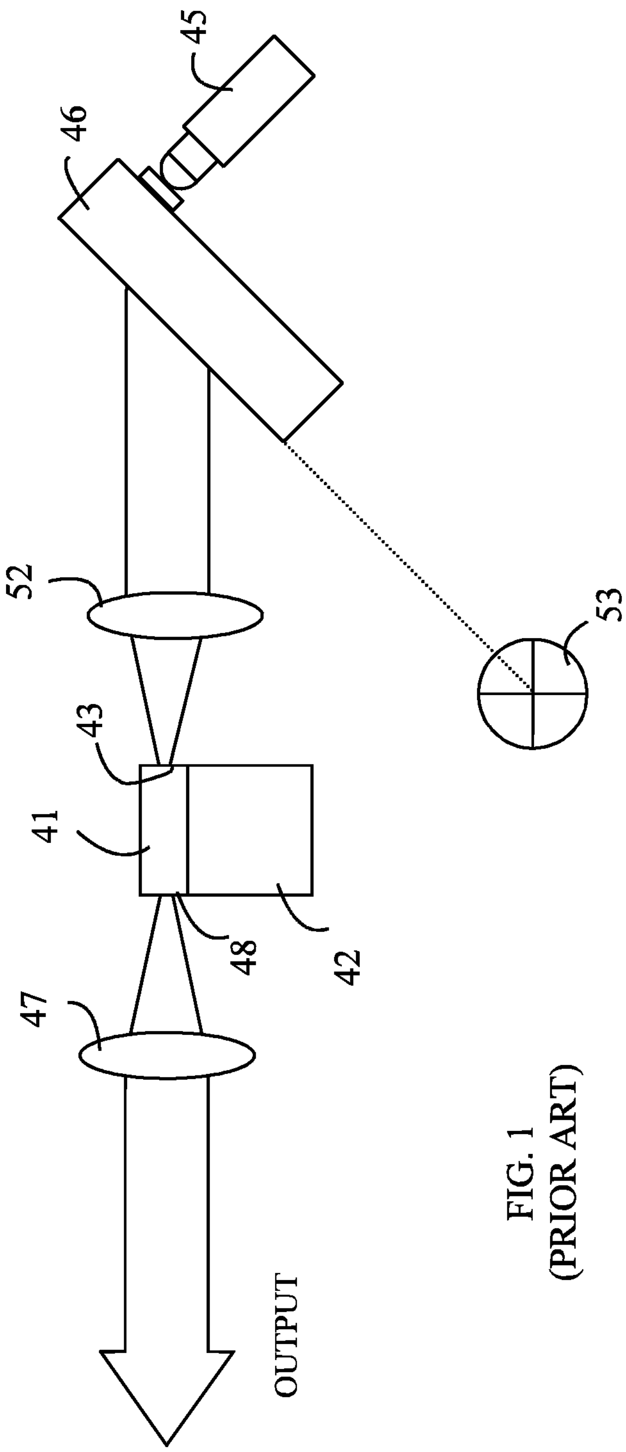
FIG. 1 illustrates a typical QCL with an EC for tuning the laser.
Figure 1:
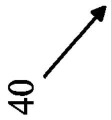

The manner in which the present invention provides its advantages can be more easily understood with reference to a QCL that uses an external cavity (EC) to tune the output wavelength. Refer now to FIG. 1, which illustrates a typical QCL with an EC for tuning the laser. Laser 40 includes a gain chip 41 that is mounted on a mount 42. Light emitted from the front facet 43 of gain chip 41 is collimated by lens 52 and reflected from a grating 46. The angle of grating 46 relative to the light beam from gain chip 41 is chosen to lock the laser on a particular mode. The angle is set by an actuator 45 that rotates the grating around an axis 53 that is chosen such that the diffracted wavelength and the length of the cavity are maintained to provide the desired wavelength. Lens 47 expands the output beam to the desired size to provide the output light that is used by the measurement system that utilizes laser 40 as its light source. Lens 52 expands the light leaving front facet 43 of gain chip 41.

The above description assumes that there are no reflections at facet 43. If facet 43 reflects light and is parallel to facet 48, the two facets form a fixed length optical cavity that "competes" with the desired optical cavity provided by facet 48 and grating 46. To avoid this problem, prior art external cavity lasers coat facet 43 with an anti-reflective coating that increases the cost of the laser. Since these lasers are designed to be tunable over a large range of wavelengths, the cost of an anti-reflective coating that operates over the entire range of wavelengths can be significant.

In prior art systems, the gain chip is typically mounted to a mount with wire bonds to electrically connect the chip to the mount. The collimator lenses are typically rigidly attached to a structure that is common with the chip mount. The collimator lens mount typically requires a number of degrees of freedom to properly align the lens with respect to the gain chip.

Figures 2, 3:
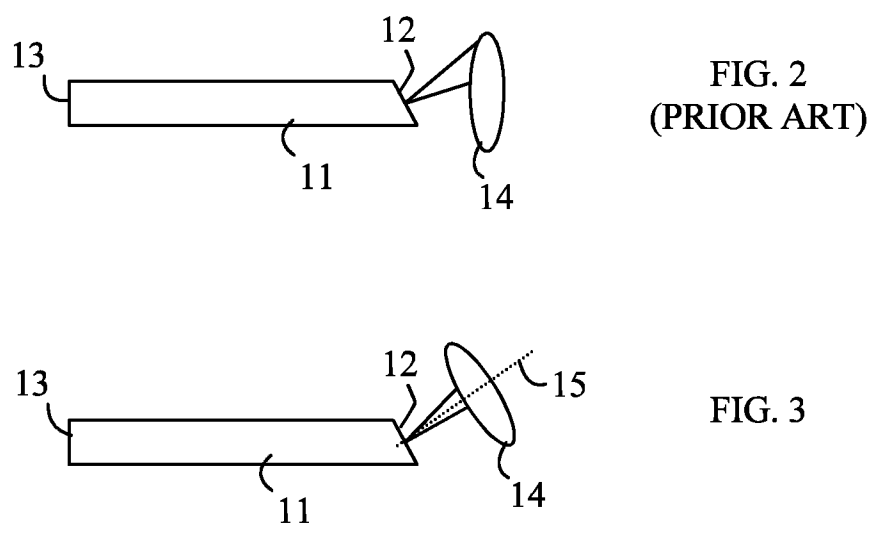

One solution to this second cavity problem utilizes a gain chip in which facet 43 is not parallel to facet 48. Refer now to FIG. 2, which illustrates a gain chip having a facet that is cut at a slight angle. Gain chip 11 has facet 12 cut at an angle between 7° and 10° relative to facet 13. Since the two ends of the gain chip are no longer parallel, light reflected from the ends cannot form a resonate cavity. The angular surface results in the light leaving facet 12 being refracted relative to the direction the light would have traveled with the conventional vertical facet. If collimating lens 14 remains in the same position as the corresponding collimating lens used with the non-inclined facet, two problems are encountered.

To generalize the following discussion to other optical systems, the angle of the end of the waveguide will be specified by the angle between the plane of the end and the light guide axis. In this nomenclature, the angle between the slanted end and waveguide axis is 80 to 83 degrees.

First, the light leaving facet 12 is not a point source, but rather extends over a small area on facet 12. Hence, part of the light will now be emitted at points that differ from the focal point of collimating lens 14. This leads to a degradation in the collimation of the light.

Second, the lower portion of collimating lens 14 is less than optimally utilized, as the beam from the angled surface does illuminate as much of the lower portion of the lens.

One method for reducing these problems involves rotating collimating lens 14 to compensate for the change in emission angles introduced by the slanted facet. Refer now to FIG. 3, which illustrates a gain chip with a rotated collimating lens. In the configuration shown in FIG. 3, collimating lens 14 has been rotated such that the optical axis 15 of collimating lens 14 is perpendicular to the surface of facet 12 and positioned at the center of the area in which light is emitted. While this solution partially compensates for the optical aberrations discussed above, it requires a complex mounting arrangement for collimating lens 14. In addition, the axis of the collimated light beam is no longer collinear with the axis of the waveguide of gain chip 13. This requires changes to the mounting system of the diffraction grating which also increases the cost of the laser.

The laser of the present disclosure overcomes these problems by utilizing a collimating lens that can be placed at the original location to compensate for the effects of the slanted facet. As used in the present disclosure, the term "collimated" describes a beam that can propagate laboratory-scale distances (a few centimeters to a few meters) without significantly changing size (beam divergence reduced to milliradian levels). For a beam in the mid-infrared (wavelength of approximately 4 to 12 microns), the beam waist must be several millimeters. In one exemplary embodiment, the beam waist is 5 millimeters. In another exemplary embodiment, the beam waist is 7 millimeters. Similarly, the focal length of the collimator lens is 2 to 5 millimeters in one exemplary embodiment.

Figure 4:
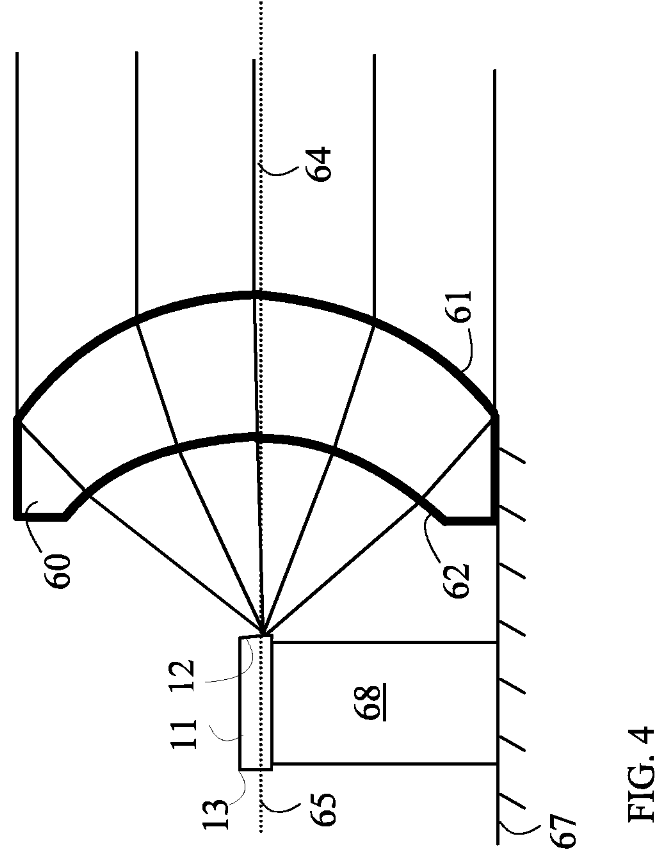
FIG. 4 illustrates a collimating lens according to one embodiment of the present invention.

Refer now to FIG. 4, which illustrates a collimating lens according to one embodiment of the present invention. Gain chip 11 includes an angled facet 12 which emits light at a location centered on the optical axis of the waveguide in gain chip 11. The light leaving facet 12 is collimated by a lens", which will be referred to as a "freeform lens". Freeform lens 60 has an outer convex spherical surface 61 and an inner concave surface 62 having a shape that is computed to collimate the light rays emitted from facet 12. This inner surface will be referred to as the freeform surface.

Freeform lenses of the type shown in FIG. 4 are known to the art, and hence, will not be discussed in detail here. For the purposes of the present disclosure, it is sufficient to note that the freeform surface is defined by a function having a number of variable parameters that are determined such that the shape of the surface together with the lens material and the other surface of the lens provides the desired collimation. In one aspect, the freeform surface is represented as a three-dimensional polynomial having a number of free parameters that are determined such that a ray leaving facet 12 and passing through the surface region will be diffracted into a ray leaving lens 60 in a direction parallel to optical axis 64. The functions describing each small surface region are further constrained such that the overall surface constructed from the collection of surface regions is a continuous and smooth surface. The individual polynomial surfaces are preferably at least quadratic, or higher. In addition, the parameters and points at which the surface regions join each other are chosen such that the first derivative of the overall surface is continuous at the points at which two surface regions are joined.

The parameters of lens 60 are also chosen such that lens 60 and gain chip mount 68 can be fastened to a common surface 67. In this arrangement, optical axis 64 is collinear with the axis 65 of the waveguide of gain chip 11. Hence, the existing geometry of the external cavity laser can be maintained while correcting for artifacts introduced by angled facet 12, and hence, substantially reducing the need for antireflective coating on facet 12.

The above-described embodiments utilize a grating for a wavelength selective filter and reflector for the external cavity. However, the collimating system of the present disclosure can be used with any external cavity quantum cascade laser to maintain the linear geometry of the laser cavity while correcting for distortions introduced by the slanted facet edge on the gain chip. In addition, this collimation system can be used with other wavelength selective filters within the external laser cavity.

Figures 5, 6:
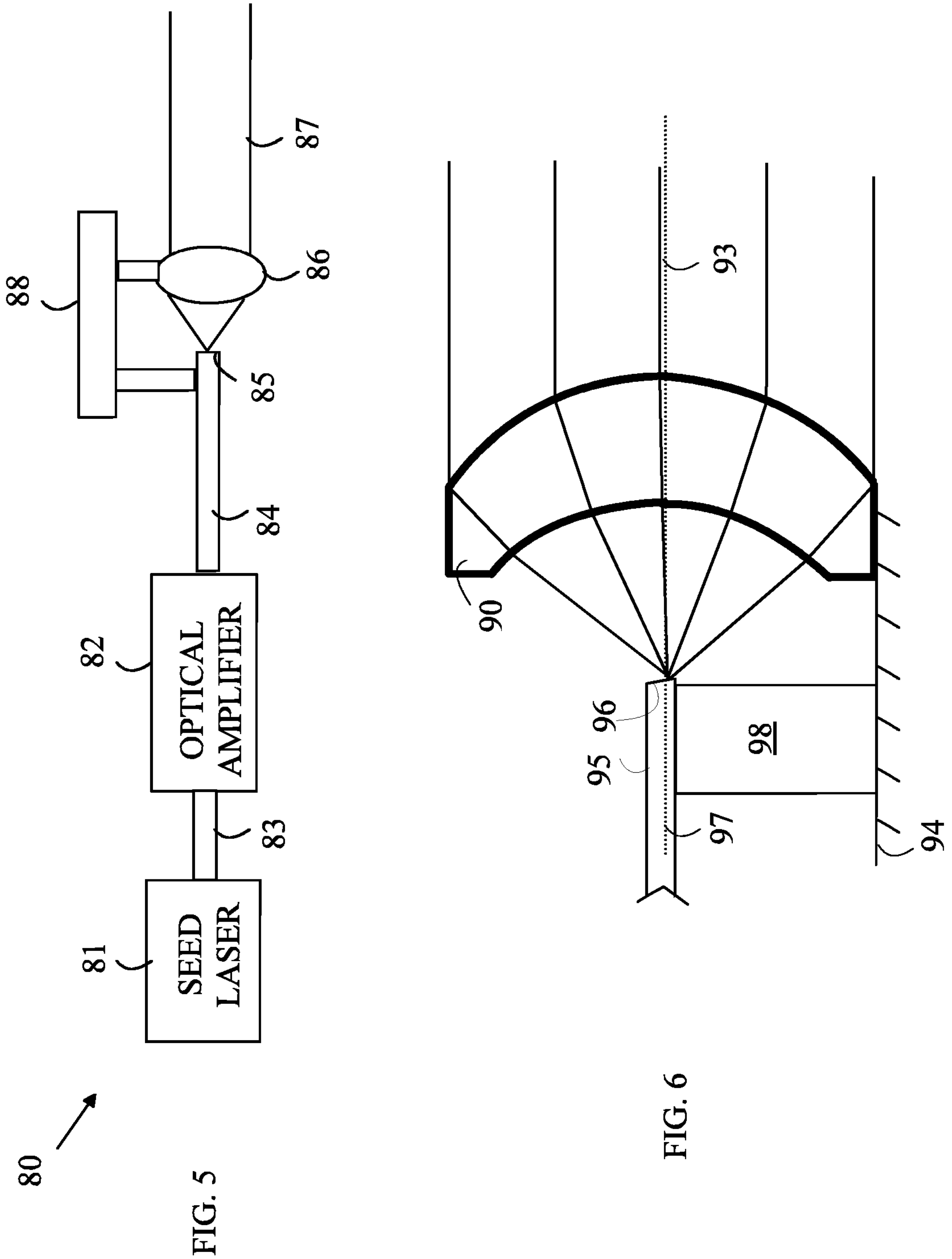
FIG. 5 illustrates an example of a master oscillator power amplifier (MOPA).
FIG. 6 illustrates a waveguide according to an embodiment of the present invention that can be used in the amplifier shown in FIG. 5.

The above-described embodiments are directed to lasers; however, the system of the present disclosure can be advantageously utilized in other optical systems in which light reflected from an exit facet of a waveguide can cause a system to laze because the exit facet provides one surface of a resonant cavity for light of the wavelength in question. Refer now to FIG. 5, which illustrates an example of a MOPA. MOPA 80 utilizes a seed laser 81 to generate a light signal that is coupled to an optical amplifier 82 by coupler 83. To simplify the drawing, the power source for optical amplifier 82 has been omitted from the drawing. The output of optical amplifier 82 is provided to an output optical fiber 84. The output optical fiber may be part of optical amplifier 82. For example, optical amplifier 82 could be a doped optical fiber that is pumped to provide the amplification. Doped optical fibers for amplifying light signals are known to the art, and hence, will not be discussed in detail here. In this case, output optical fiber 84 may be the end of the doped optical fiber. The output of output optical fiber 84 is typically expanded into a collimated light beam 87 by a collimating lens 86. Collimating lens 86 is rigidly connected to output optical fiber 84 by a mounting structure 88 which is analogous to the mounting structures discussed in the above-described embodiments of lasers.

One problem with the arrangement shown in FIG. 5 arises from reflections at surface 85. Typically surface 85 is perpendicular to the axis of output fiber 84. If the reflectivity at surface 85 is sufficient, a laser cavity is formed by surface 85 and the reflecting surface in seed laser 81 or coupler 83. As a result, optical amplifier 82 can become a separate laser with spectral patterns that differ from those of seed laser 81. Hence, surface 85 is often coated with an antireflective coating which increases the cost of MOPA 80.

Refer now to FIG. 6, which illustrates a waveguide that can be used in place waveguide 84 shown in FIG. 5. Waveguide 95 has an end surface 96 that is cut at an angle that is not 90 degrees with respect to optical axis 97. The angle of end surface 96 with respect to axis 97 is chosen such that reflections from surface 96 are not directed back down waveguide 95, and hence, the lasing problem discussed above is avoided. A freeform lens 90 provides the collimation of the output light from waveguide 95 in the direction of axis 97. The optical axis 93 of the collimated beam is coincident with the optical axis of waveguide 95 in this example. Waveguide 95 is immobilized on a mount 98 that is rigidly positioned relative to the freeform lens via attachment to a common surface 94.

EXEMPLARY EMBODIMENTS

Embodiment 1. An apparatus comprising: a waveguide characterized by a waveguide axis and a planar end having a normal axis that is inclined at an end angle that is greater than 0 degrees with respect to said waveguide axis; and a freeform collimating lens that collimates light leaving said planar end of said waveguide into a collimated light beam characterized by a beam direction that is parallel to said waveguide axis.

Embodiment 2. The apparatus of Embodiment 1 wherein said end angle is greater than 7 degrees.

Embodiment 3. The apparatus of Embodiment 1 or 2 further comprising an optical amplifier that amplifies light that is reflected from said planar end, said end angle preventing lasing in a system incorporating said apparatus.

Embodiment 4. The apparatus of Embodiment 3 wherein said optical amplifier comprises a quantum cascade gain chip.

Embodiment 5. The apparatus of Embodiment 3 wherein said optical amplifier comprises a doped optical fiber.

Embodiment 6. The apparatus of any of Embodiments 1 to 4 further comprising an external cavity reflector that returns a collimated beam of light to said freeform collimating lens, said returned light travelling in a direction parallel to said waveguide axis.

Embodiment 7. The apparatus of Embodiment 6 comprises a cavity that is external to said quantum cascade gain chip, wherein said cavity comprises a wavelength selective filter.

Embodiment 8. The apparatus of Embodiment 7 wherein said wavelength selective filter comprises a diffraction grating.

Embodiment 9. The apparatus of any of Embodiments 1 to 8 wherein said freeform collimating lens comprises a freeform concave surface proximate to said planar end and a spherical convex surface distal to said planar end.

Embodiment 10. The apparatus of any of Embodiments 1 to 9 further comprising a lens mount that positions said freeform collimating lens relative to said quantum cascade gain chip to maintain said beam direction parallel to said waveguide axis.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following Claims.

What is claimed is:

1. An apparatus comprising:

a waveguide characterized by a waveguide axis and a planar end having a normal axis that is inclined at an end angle that is greater than 0 degrees with respect to said waveguide axis; and a freeform collimating lens that collimates light leaving said planar end of said waveguide into a collimated light beam characterized by a beam direction that is parallel to said waveguide axis, wherein said freeform collimating lens comprises a freeform concave surface proximate to said planar end, said freeform concave surface having a shape that is computed to collimate said light leaving said planar end having said normal axis that is inclined at said angle that is greater than 0 degrees with respect to said waveguide axis.

2. The apparatus of claim 1 wherein said end angle is greater than 7 degrees.

3. The apparatus of claim 1 further comprising an optical amplifier that amplifies light that is reflected from said planar end, said end angle preventing lasing in a system incorporating said apparatus.

4. The apparatus of claim 3 wherein said optical amplifier comprises a quantum cascade gain chip.

5. The apparatus of claim 3 wherein said optical amplifier comprises a doped optical fiber.

6. The apparatus of claim 4 further comprising an external cavity reflector that returns a collimated beam of light to said freeform collimating lens, said returned light travelling in a direction parallel to said waveguide axis.

7. The apparatus of claim 6 comprises a cavity that is external to said quantum cascade gain chip, wherein said cavity comprises a wavelength selective filter.

8. The apparatus of claim 7 wherein said wavelength selective filter comprises a diffraction grating.

9. The apparatus of claim 1 wherein said freeform collimating lens comprises a spherical convex surface distal to said planar end.

10. The apparatus of claim 4 further comprising a lens mount that positions said freeform collimating lens relative to said quantum cascade gain chip to maintain said beam direction parallel to said waveguide axis.

11. The apparatus of claim 7 wherein said light leaving said planar end is refracted light.

* * * * *